US012700451B2

(12) United States Patent
Suzuki et al.

(10) Patent No.: US 12,700,451 B2
(45) Date of Patent: Aug. 4, 2026

(54) APPARATUSES AND METHODS FOR REDUCING STANDBY CURRENT IN MEMORY ARRAY ACCESS CIRCUITS

(71) Applicant: MICRON TECHNOLOGY, INC., Boise, ID (US)

(72) Inventors: Takamasa Suzuki, Hachioji (JP); Nobuo Yamamoto, Nerima-ku (JP); Izumi Nakai, Kawagoe (JP)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 18/591,798

(22) Filed: Feb. 29, 2024

(65) Prior Publication Data

US 2024/0331763 A1     Oct. 3, 2024

Related U.S. Application Data

(60) Provisional application No. 63/493,407, filed on Mar. 31, 2023.

(51) Int. Cl.
| | |
|---|---|
| *G11C 7/06* | (2006.01) |
| *G11C 11/4074* | (2006.01) |
| *G11C 11/4091* | (2006.01) |
| *G11C 11/4096* | (2006.01) |

(52) U.S. Cl.
CPC ...... *G11C 11/4096* (2013.01); *G11C 11/4074* (2013.01); *G11C 11/4091* (2013.01)

(58) Field of Classification Search
CPC ............ G11C 11/4091; G11C 11/4094; G11C 11/4097
See application file for complete search history.

(56) References Cited

U.S. PATENT DOCUMENTS

| | | | | |
|---|---|---|---|---|
| 2006/0028888 A1* | 2/2006 | Shin | ..................... | G11C 11/4091 |
| | | | | 365/205 |
| 2006/0092735 A1* | 5/2006 | Do | ......................... | G11C 7/1048 |
| | | | | 365/207 |
| 2010/0110772 A1* | 5/2010 | Lee | ...................... | G11C 11/4094 |
| | | | | 365/207 |
| 2010/0157702 A1* | 6/2010 | Seo | ....................... | G11C 7/1069 |
| | | | | 365/194 |
| 2010/0202189 A1* | 8/2010 | Jung | ................... | G11C 11/4096 |
| | | | | 365/203 |
| 2010/0226192 A1* | 9/2010 | Moon | ................. | G11C 11/4096 |
| | | | | 365/203 |

(Continued)

*Primary Examiner* — Mushfique Siddique

(74) *Attorney, Agent, or Firm* — Dorsey & Whitney LLP

(57) ABSTRACT

Apparatuses and methods for reducing standby current in memory array access circuits are disclosed. An example apparatus includes a activation voltage supply line and a sense amplifier coupled to the activation voltage supply line. The sense amplifier is configured to be activated by an activation voltage provided on the activation voltage supply line. A read-write circuit is coupled to a pair of local input/output lines and a pair of global input/output lines, and further coupled to the activation voltage supply line. The read-write circuit is configured to drive the pair global input/output lines based on voltages of the pair of local input/output lines when activated for a read operation and further configured to drive the pair of local input/output lines based on voltages of the pair of global input/output lines when activated for a write operation.

19 Claims, 4 Drawing Sheets

(56) References Cited

U.S. PATENT DOCUMENTS

2010/0315893  A1*  12/2010  Hong ................... G11C 7/1078
                                                                                 365/189.11
2011/0032780  A1*   2/2011  Teramoto ........... G11C 11/4097
                                                                                 365/205
2011/0103123  A1*   5/2011  Nakaoka ............ G11C 11/4074
                                                                                 365/63
2011/0141830  A1*   6/2011  Chi ..................... G11C 11/4091
                                                                                 365/189.11
2015/0187402  A1*   7/2015  Chun ....................... G11C 8/10
                                                                                 365/230.02
2019/0304516  A1*  10/2019  Shimizu ................. G11C 29/52
2023/0230634  A1*   7/2023  Wang ................. G11C 11/4097
                                                                                 365/189.14

* cited by examiner

APPARATUSES AND METHODS FOR REDUCING STANDBY CURRENT IN MEMORY ARRAY ACCESS CIRCUITS

CROSS-REFERENCE TO RELATED APPLICATIONS

This application claims the filing benefit of U.S. Provisional Application No. 63/493,407, filed Mar. 31, 2023. This application is incorporated by reference herein in its entirety and for all purposes.

BACKGROUND

In semiconductor devices, such as those including dynamic random access memory, reducing power consumption is an ongoing effort. These devices consume power during operation, and also consume power (although much less) during standby. With reference to semiconductor memory, while no access operations are performed during standby, limited memory operations necessary to maintain data states stored by the memory are nonetheless performed (e.g., refresh operations), which consumes power. Standby power consumption may also be influenced by leakage and parasitic currents of the circuits, for example, resulting from currents being drawn due to standby voltage conditions for the various memory circuits. The standby voltage conditions may depend on the system voltage of the system including the memory device. It may be desirable to provide power to the various memory circuits to set standby voltage conditions that may reduce standby current consumption while accommodating various system voltages.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
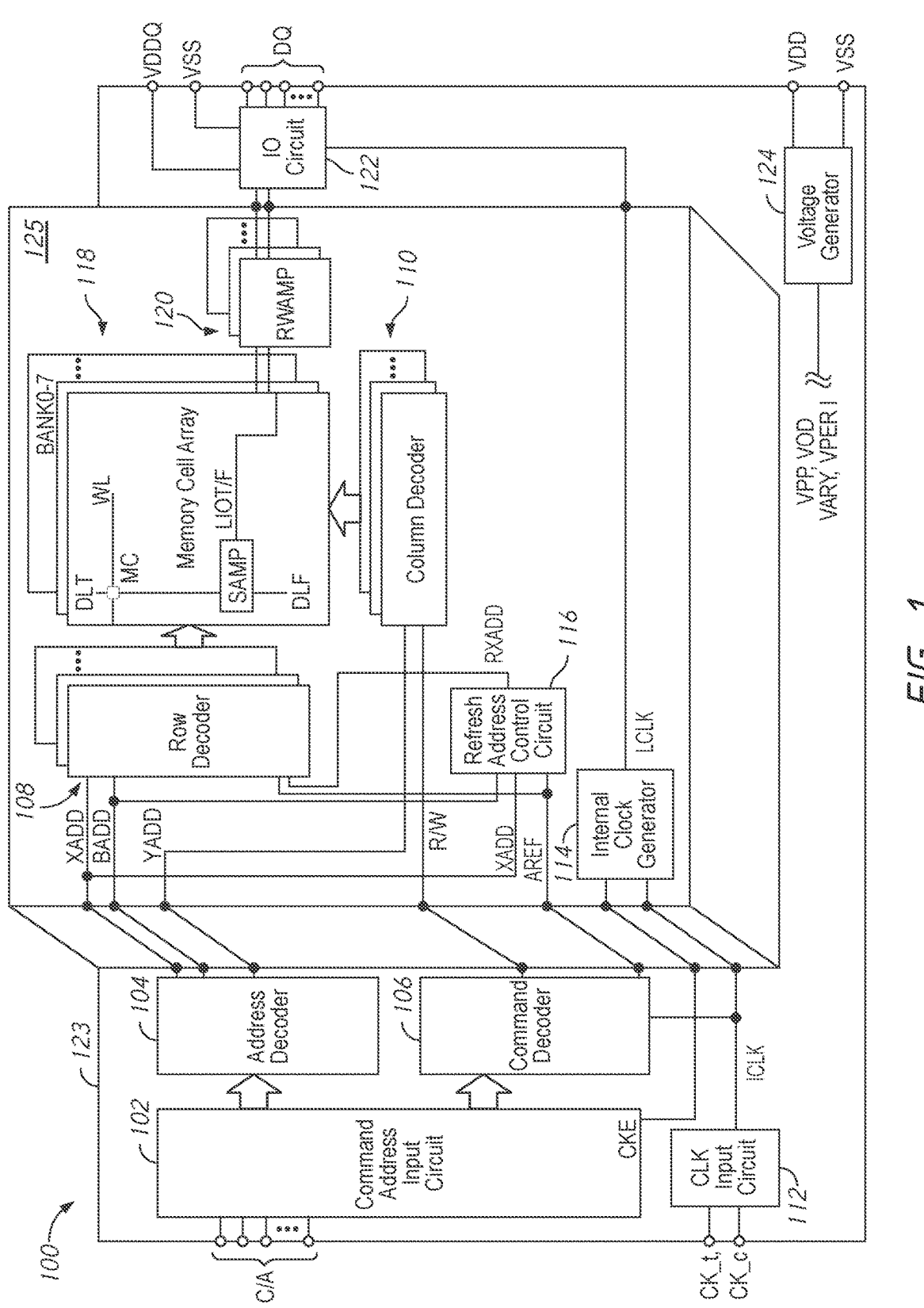
FIG. 1 is a block diagram of a semiconductor device according to some embodiments of the disclosure.

FIG. 1 is a block diagram of a semiconductor device according to some embodiments of the disclosure. The semiconductor device 100 may be a semiconductor memory device, such as a DRAM device integrated on a single semiconductor chip. The example device 100 of FIG. 1 includes a memory package such as the stack 125 of memory dies positioned on a logic die 123, which may function as (and may be referred to) as an interface. Although certain components are shown in the dies of the stack 125, and certain components on the a logic die 123, other arrangement of the components of the device 100 between the stack 125 and the a logic die 123 are possible in other example embodiments. In some embodiments, the device 100 may include multiple stacks 125.

For brevity and clarity of illustration, only the components of one memory die in the memory stack 125 are shown in FIG. 1. Generally, the different dies of the stack 125 may each have similar components to each other. In some embodiments, each die of the stack 125 may be physically identical to each other. The a logic die 123 may act as an interface, and may send and receive information (e.g., data, commands) to and from the outside, while the memory dies in the stack 125 communicate with components of the substrate. As described herein, commands and other signals sent by the a logic die 123 may be sent to all dies in the stack 125 or may be separately addressed to individual dies of the stack 125.

The semiconductor device 100 includes a memory array 118. The memory array 118 may be positioned in a die of the memory stack 125. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of digit lines DLT and DLF, and a plurality of memory cells MC arranged at intersections of the plurality of word lines WL and the plurality of digit lines DLT and DLF. The selection of the word line WL is performed by a row decoder 108 and the selection of the digit lines DLT and DLF is performed by a column decoder 110. The row decoder 108 and the column decoder 110 may include control circuits that provide control signals to circuits in the memory array to perform memory access operations. The row and column decoders 108 and 110 may also be positioned in the dies of the memory stack 125. In the embodiment of FIG. 1, the row decoder 108 includes a respective row decoder for each memory bank and the column decoder 110 includes a respective column decoder for each memory bank. The digit lines DLT and DLF are coupled to a respective sense amplifier (SAMP). Read data from the digit line DLT or DLF is amplified by the sense amplifier SAMP, and transferred to read-write amplifiers 120 over complementary local data lines (LIOT/F). Conversely, write data outputted from the read-write amplifiers 120 is transferred to the sense amplifier SAMP over the complementary local data lines LIOT/F, and written in the memory cell MC coupled to the digit line DLT or DLF.

The semiconductor device 100 may employ a plurality of external terminals that include command and address (CA) terminals coupled to a command and address bus to receive commands and addresses, clock terminals to receive clocks CK_t and CK_c, data terminals DQ to provide read data and receive write data, and power supply terminals to receive power supply potentials VDD, VSS, and VDDQ. The external terminals may be positioned on the a logic die 123.

The clock terminals are supplied with external clocks CK_t and CK_c that are provided to an input circuit 112. The external clocks may be complementary. The input circuit 112 generates an internal clock ICLK based on the CK_t and CK_c clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data and to data transmitters to time the output of read data.

The CA terminals may be supplied with memory addresses. The memory addresses supplied to the CA terminals are transferred, via a command/address input circuit 102, to an address decoder 104. The address decoder 104 receives the address and supplies a decoded row address XADD to the row decoder 108 and supplies a decoded column address YADD to the column decoder 110. The row decoder 108 and column decoder 110 may in turn provide control signals to circuits of the memory array 118 to access the memory corresponding to the decoded row address XADD and decoded column address YADD. The address decoder 104 may also supply a decoded bank address BADD, which may indicate the bank of the memory array 118 containing the decoded row address XADD and column address YADD. In some embodiments, the address decoder 104 may also indicate a particular memory die of the memory stack 125 for activation.

The CA terminals may be supplied with commands. Examples of commands include refresh commands for refreshing memory cells of the memory array, activation commands to activate the memory array, access commands for accessing the memory, such as read commands for performing read operations and write commands for performing write operations, as well as other commands and operations. The activation and access commands may be associated with one or more row address XADD, column address YADD, and bank address BADD to indicate the memory cell(s) to be accessed. The commands may be provided as internal command signals to a command decoder 106 via the command/address input circuit 102. The command decoder 106 includes circuits to decode the internal command signals to generate various internal signals and commands for performing operations. For example, the command decoder 106 may provide to the row and column decoders an internal read enable signal for a read access operation and provide an internal write enable signal for a write access operation.

The device 100 may receive an activation command and an access command which is a read command. When activation and read commands are received, and a bank address, a row address and a column address (and optional die address) are timely supplied with the activation and read commands, read data is read from memory cells in the memory array 118 corresponding to the row address and column address. The activation and read commands are received by the command decoder 106, which provides internal commands so that read data from the memory array 118 is provided to the read-write amplifiers 120. The read data is output to outside from the data terminals DQ via the input/output circuit 122.

The device 100 may receive an activation command and an access command which is a write command. When the activation and write commands are received, and a bank address, a row address and a column address (and optional die address) are timely supplied with the activation and write commands, write data supplied to the data terminals DQ is written to a memory cells in the memory array 118 corresponding to the row address and column address. The activation and write commands are received by the command decoder 106, which provides internal commands so that the write data is received by data receivers in the input/output circuit 122. The write data is supplied via the input/output circuit 122 to the read-write amplifiers 120, and by the read-write amplifiers 120 to the memory array 118 to be written into the memory cell MC.

The device 100 may also receive commands causing it to carry out refresh operation. The refresh signal AREF is activated when the command decoder 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and maybe others based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSS. The power supply potentials VDDQ and VSS are supplied to the input/output circuit 122. The power supply potential VDDQ supplied to the power supply terminals may be the same potentials as the power supply potential VDD supplied to the power supply terminals in an embodiment of the disclosure. The power supply potential VDDQ supplied to the power supply terminals may be different potentials from the power supply potential VDD supplied to the power supply terminals in another embodiment of the disclosure. The power supply potential VDDQ and VSS supplied to the power supply terminals are used for the input/output circuit 122 so that power supply noise generated by the input/output circuit 122 does not propagate to the other circuit blocks.

Figure 2:
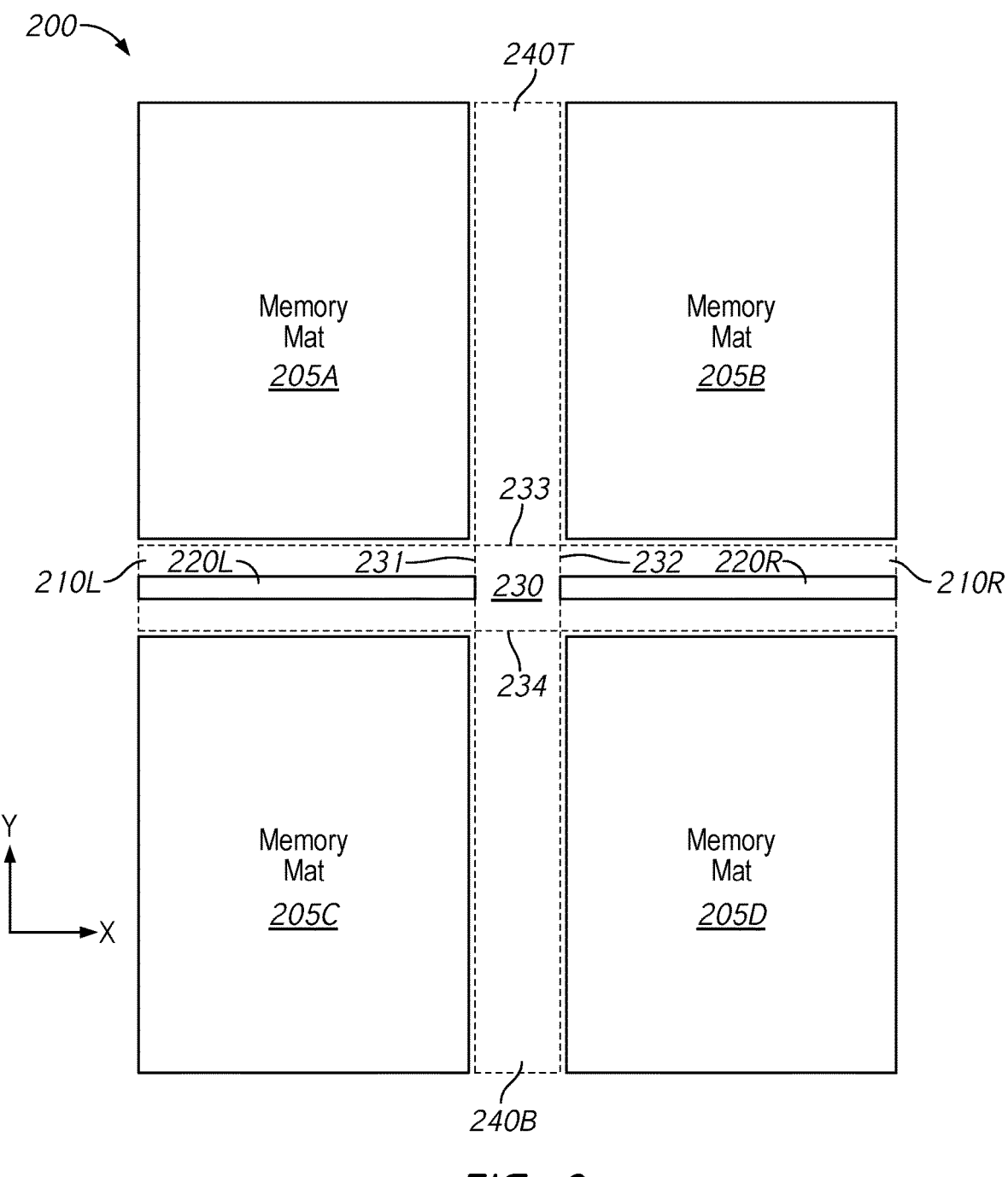
FIG. 2 is a block diagram of a portion of a memory array according to some embodiments of the disclosure.

FIG. 2 is a block diagram of a portion of a memory array 200 according to some embodiments of the disclosure. The memory array 200 may be included in the memory array 118 of the semiconductor device 100 in some embodiments of the disclosure.

The memory array 200 includes memory mats 205A-205D and "gap regions" between the memory mats 205. The memory mats 205 include memory cells coupled to word lines and digit lines, with memory cells at the intersections of the word and digit lines. The gap regions include sense amplifier gap region 210L between memory mats 205A and 205C, and include sense amplifier gap region 210R between memory mats 205B and 205D. The sense amplifier gap regions 210L and 210R include sense amplifiers that are coupled to digit lines of the memory mats 205A and 205C, and to digit lines of the memory mats 205B and 205D, respectively. The sense amplifier gap regions 210L and 210R also each include one or more local input/output (LIO) lines that extend in the sense amplifier gap regions. The LIO lines of 210L may be coupled to the digit lines of the memory mats 205A and 205C to provide data to and from the memory cells, and the LIO lines of 210R may be coupled to the digit lines of the memory mats 205B and 205D to provide data to and from the memory cells. The sense amplifier gap regions 210L and 210R also include read-write gap regions 220L and 220R, respectively. The read-write gap regions 220L and 220R include circuits for accessing memory cells of the memory mats 105, for example, read-write RW circuits coupled to the LIO lines, and to global input/output (GIO) lines that are used to transfer data to and from the memory cells from input/output circuits (e.g., input/output circuit 122 of FIG. 1). In some embodiments, circuits that provide activation voltages to circuits in the sense amplifier gap regions may also be included in the read-write gap regions 220L and 220R. For example, in some embodiments of the disclosure, the read-write gap regions 220L and 220R include activation voltage circuits that provide activation voltages to sense amplifiers in the sense amplifier gap regions 210L and 210R. Activation voltage supply lines coupled to activation voltage circuits may also be included in the gap regions. Activation voltages from the activation voltage circuits may be provided over the supply lines to sense amplifiers, for example.

The gap regions further include word driver gap region 240T between memory mats 205A and 205B, and further include word driver gap region 240B between memory mats 205C and 205D. The word driver gap regions 240T and 240B may include sub-word line driver circuits coupled to word lines of the memory mats 205A and 205B, and the memory mats 205C and 205D, respectively. The gap regions also include a minigap region 230 that is adjacent the sense amplifier region 210L and also adjacent the sense amplifier region 210R.

Figure 3:
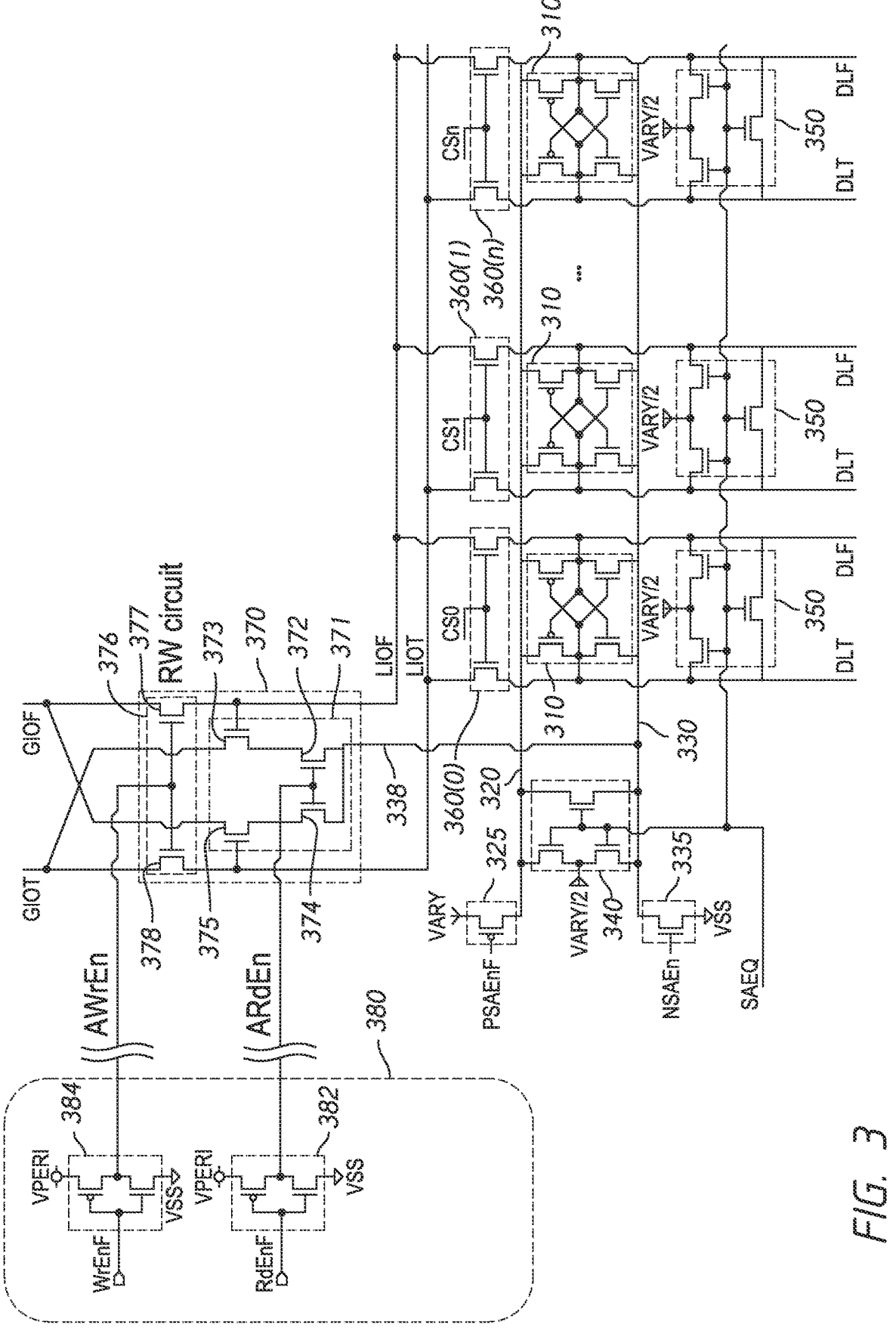
FIG. 3 is a diagram of memory access circuits according to some embodiments of the disclosure.

FIG. 3 is a diagram of memory access circuits according to some embodiments of the disclosure. In some embodiments of the disclosure, the circuits of FIG. 3 may be included in the semiconductor device 100 of FIG. 1 and/or included gap regions of the portion of the memory array 200 of FIG. 2.

Sense amplifiers 310 are coupled to respective digit lines DLT and DLF. The sense amplifiers 310 are coupled to an activation voltage supply line 320 and an activation voltage supply line 330. An activation voltage circuit 325 is coupled to the supply line 320 and receives an array supply voltage VARY. In some embodiments of the disclosure, the array supply voltage VARY may be between 0.7 volts and 1.3 volts. In some embodiments of the disclosure, the array supply voltage VARY may be between 0.9 volts and 1.1 volts. In some embodiments of the disclosure, the array supply voltage VARY may be 1.0 volts. When activated by an active control signal PSAEnF (e.g., PSAEnF active when low), the activation voltage circuit 325 provides the array supply voltage VARY as a high level activation voltage to the sense amplifiers 310. An activation voltage circuit 335 is coupled to the conductive activation voltage supply line 330 and receives an reference voltage, for example VSS (which in some embodiments is ground). When activated by an active control signal NSAEn (e.g., NSAEn active when high), the activation voltage circuit 335 provides the reference voltage VSS as a low level activation voltage to the sense amplifiers 310 on the supply line 330.

A sense amplifier precharge circuit 340 is coupled to the activation voltage supply lines 320 and 330, and receives a supply voltage VARY/2, which in some embodiments of the disclosure is one-half of the array supply voltage VARY. In some embodiments of the disclosure, the supply voltage VARY/2 may be between 0.3 volts and 0.7 volts. In some embodiments of the disclosure, the supply voltage VARY/2 may be between 0.4 volts and 0.6 volts. In some embodiments of the disclosure, the supply voltage VARY/2 may be 0.5 volts. When activated by an active control signal SAEQ (e.g., SAEQ active when high), the sense amplifier precharge circuit 340 provides the supply voltage VARY/2 as a sense amplifier precharge voltage on the activation voltage supply lines 320 and 330 to the sense amplifiers 310. Digit line precharge circuits 350 are coupled to respective digit lines DLT and DLF. The digit line precharge circuits 350 receive the control signal SAEQ and receive the supply voltage VARY/2. The digit line precharge circuits 350 are activated by the control signal SAEQ when it is active. When activated, the digit line precharge circuits 350 provide the supply voltage VARY/2 as a precharge voltage to the respective digit lines DLT and DLF. The sense amplifiers 310 and the digit lines DLT and DLF are precharged by the sense amplifier precharge circuit 340 and the digit line precharge circuits 350 in preparation for a later access operation.

Column select switches 360(0)-360(n) are coupled to respective digit lines DLT and DLF, and further coupled to local input/output lines LIOT and LIOF. The column select switches 360(0)-360(n) receive a respective column select signal CS. For example, the column select switch 360(0) receives the column select signal CS0, the column select switch 360(1) receives the column select signal CS1, and so on. When activated by a respective active column select signal CS, the column select switch 360 provides the voltages of the respective digit lines DLT and DLF to the local input/output lines LIOT and LIOF. The column select signals CS may be provided, for example, by a column decoder to select a particular column of memory to access.

A read-write circuit 370 is coupled to the local input/output lines LIOT and LIOF, and further coupled to global input/output lines GIOT and GIOF. The read-write circuit 370 receives read control signal ARdEn and write control signal AWrEn. For read access operations, the read-write circuit 370 drives the global input/output lines GIOT and GIOF based on the voltages of the local input/output lines LIOT and LIOF. The voltages of the global input/output lines GIOT and GIOF during a read access operation represent read data that is read from selected memory cells. For write access operations, the read-write circuit 370 drives the local input/output lines LIOT and LIOF based on the voltages of the global input/output lines LIOT and LIOF, which represent write data to be written to selected memory cells.

The read-write circuit 370 includes a read circuit 371 that receives the read control signal ARdEn, and further includes a write circuit 376 that receives the write control signal AWrEn. The read-write circuit 370 is also coupled to the activation voltage supply line 330. In some embodiments of the disclosure, the read-write circuit 370 may be coupled to the activation voltage supply line 330 by a read-write circuit supply line 338. In some embodiments of the disclosure, the read-write circuit supply line 338 may include a conductive line and/or conductive via extending between the read-write circuit 370 and the activation voltage supply line 330. In some embodiments of the disclosure, the read-write circuit 370 may be coupled to the activation voltage supply line 330 without a read-write circuit supply line 338.

The read circuit 371 includes transistors 372 and 373 coupled in series to the global input/output line GIOT and the activation voltage supply line 330, and further includes transistors 374 and 375 coupled in series to the global input/output line GIOF and the activation voltage supply line 330. The read control signal ARdEn is provided to gates of the transistors 372 and 374, and the activation voltage supply line 330 is coupled to sources of the transistors 372 and 374. In some embodiments, sources of the transistors 372 and 374 are coupled to the activation voltage supply line 330 by the read-write circuit supply line 338. The local input/output line LIOT is coupled to a gate of the transistor 375 and the local input/output line LIOF is coupled to a gate of the transistor 373. As previously described, the activation voltage supply line 330 to which the read-write circuit 370 is coupled is also coupled to the sense amplifiers 310, and also coupled to activation voltage circuit 335 and sense amplifier precharge circuit 340. Thus, the read-write circuit 370 is provided the voltage of the activation voltage supply line 330.

The write circuit 376 includes transistor 378 coupled to the global input/output line GIOT and the local input/output line LIOT, and further includes transistor 377 coupled to the global input/output line GIOF and the local input/output line LIOF. The write control signal AWrEn is provided to gates of the transistors 377 and 378.

The read and write control signals ARdEn and AWrEn may be provided to the read-write circuit 370 by a read-write control circuit 380. The read-write control circuit 380 may be included in a row decoder circuit in some embodiments of the disclosure (e.g., row decoder 108 of FIG. 1). The read-write control circuit 380 includes a read control circuit 382 and a write control circuit 384. The read control circuit 382 receives an internal read enable signal RdEnF and the write control circuit 384 receives an internal write enable signal WrEnF, both of which may be provided by a command decoder (e.g., command decoder 106 of FIG. 1).

For a read access operation, an active internal read enable signal RdEnF (e.g., active low level) is provided to the read control circuit 382. The active internal read enable signal RdEnF causes the read control circuit 382 to provide an active read control signal ARdEn having an active voltage level, for example, VPERI, to set the read-write circuit 370 for a read access operation. During a standby mode or for a write access operation, an inactive read enable signal RdEnF (e.g., inactive high level) is provided to the read control circuit 382. The inactive internal read enable signal RdEnF causes the read control circuit 382 to provide an inactive read control signal ARdEn having an inactive voltage level to set the read-write circuit 370 for standby mode and when the read-write control circuit 370 is set for a write access operation. In some embodiments of the disclosure, the inactive voltage level of the read control signal ARdEn, for example, is VSS (e.g., ground). In a standby mode, no access operations are performed, and limited memory operations necessary to maintain data states stored by the memory are performed (e.g., refresh operations).

For a write access operation, an active internal write enable signal WrEnF (e.g., active low level) is provided to the write control circuit 384. The active internal write enable signal WrEnF causes the write control circuit 384 to provide an active write control signal AWrEn having an active voltage level, for example, VPERI, to set the read-write circuit 370 for a write access operation. During a standby mode or for a read access operation, an inactive write enable signal WrEnF (e.g., inactive high level) is provided to the write control circuit 384. The inactive internal write enable signal WrEnF causes the write control circuit 384 to provide an inactive write control signal AWrEn having an inactive voltage level, for example, VSS, to set the read-write circuit 370 for standby mode and when the read-write control circuit 370 is set for a read access operation.

Particular example circuits have been shown in FIG. 3 for the sense amplifiers 310, activation voltage circuits 325 and 335, the sense amplifier precharge circuit 340, digit line precharge circuits 350, column select switches 360, the read-write circuit 370, and the read-write control circuit 380. However, in other embodiments of the disclosure, alternative or additional circuits may be included in the described circuits. For example, with reference to the sense amplifiers 310, the sense amplifiers 310 are shown in FIG. 3 as including cross-coupled complementary field-effect transistors. However, in some embodiments of the disclosure, the sense amplifiers 310 may alternatively include voltage threshold compensated sense amplifiers VTCSAs. In some embodiments of the disclosure, some of the previously described circuits may not be included. For example, the digit line precharge circuits 350 may not be included in embodiments of the disclosure where the digit lines DLT and DLF and/or sense amplifiers 310 are precharged by local input/output line precharge circuits (not shown).

In operation, the sense amplifiers 310 and the pairs of digit lines DLT and DLF are in a precharge state prior to a memory access operation, with the sense amplifier and the digit lines DLT and DLF set to a precharge voltage (e.g., VARY/2) by activated sense amplifier precharge circuit 340 and the digit line precharge circuits 350.

Following activation of the memory cells to be accessed, the stored charge states of the memory cells are provided to a respective one of the digit lines DLT or DLF to create a voltage difference between the respective of digit lines DLT and DLF. The sense amplifiers 310 are activated to amplify the voltage difference on the respective pairs of the digit lines by providing activation voltages to the activation voltage supply lines 320 and 330. The activation voltage circuit 325 is activated by an active PSAEnF signal to provide the high activation voltage (e.g., VARY) to the activation voltage supply line 320 and the activation voltage circuit 335 is activated by an active NSAEn signal to provide the low activation voltage (e.g., VSS) to the activation voltage supply line 330. With the voltage differences on the digit lines DLT and DLF amplified by the respective activated sense amplifiers 310, one or more of the column select switches 360(0)-360(n) are activated to provide the respective amplified voltage difference from the digit lines DLT and DLF to the local input/output lines LIOT and LIOF.

In a read access operation, the read-write circuit 370 is enabled for a read access operation by an active read enable signal ARdEn and inactive write enable signal AWrEn. When enabled for a read access operation, based on the amplified voltage difference on the local input/output lines LIOT and LIOF, the read-write circuit 370 drives one of the global input/output lines GIOT and GIOF (which are precharged to a high precharge voltage) to the low activation voltage of the activation voltage supply line 330. The low activation voltage may be provided to the read-write circuit 370 in some embodiments through conductive RW power supply line 338 coupled to the read-write circuit 370 and the activation voltage supply line 330. As a result, one of the global input/output lines GIOT and GIOF have a high level voltage, and the other global input/output lines GIOF and GIOT have a low level voltage provided by the activation voltage supply line 330. The voltages of the global input/output lines GIOT and GIOF are provided to data output circuits which drive output data signals on the data terminals of the semiconductor device.

In a write access operation the read-write circuit 370 is enabled for a write access operation by an inactive read enable signal ARdEn and active write enable signal AWrEn. The global input/output lines GIOT and GIOF are set to voltages representing the write data, and the read-write circuit 370 enabled for a write access operation provides the voltages of the global input/output lines GIOT and GIOF to the local input/output lines LIOT and LIOF, respectively. The voltages on the local input/output lines LIOT and LIOF set by the read-write circuit 370 are provided through an activated column select switch 360 to set the voltages of the digit lines DLT and DLF. The voltage of the digit line DLT or DLF is provided to an activated memory cell to write the write data.

In preparation for a later access operation, a precharge operation is performed to set the digit lines DLT and DLF, the sense amplifiers 310, and the activation voltage supply lines 320 and 330 to the precharge voltages. For example, sense amplifier precharge circuit 340 and digit line precharge circuits 350 are activated by an active control signal SAEQ. The sense amplifiers 310 are provided the sense amplifier precharge voltage by the activated sense amplifier precharge circuit 340 over the activation voltage supply lines 320 and 330, and the digit lines DLT and DLF are provided the digit line precharge voltage by the activated digit line precharge circuits 350.

During standby, the activation voltage supply line 320 and/or the voltage of the activation supply line 330 are at a precharge voltage, VARY/2, which may be provided by the sense amplifier precharge circuit 340. Thus, the precharge voltage is provided to the sense amplifiers 310 during standby, and the precharge voltage is also provided to the read-write circuit 370 from the activation voltage supply line 330 during standby.

Also during standby, as previously described, the read write control circuit 380 provides an inactive read control signal ARdEn having an inactive voltage level VSS, and also provides an inactive write control signal AWrEn having an inactive voltage level VSS. Standby current consumption may be controlled by providing an inactive read control signal ARdEn having the inactive voltage level VSS and providing the precharge voltage VARY/2 to the read-write circuit 370. For example, a negative gate-source voltage condition is created by the inactive voltage level VSS provided to gates of the transistors 372 and 374 of the read circuit 371, and the precharge voltage VARY/2 provided to sources of the transistors 372 and 374. With the negative gate-source voltage condition, the transistors 372 and 374 are non-conductive to control (standby) current consumption. Additionally, when using higher voltages, for example, voltages greater than 1.2 volts, greater reliability may result from creating the negative gate-source voltage condition by providing VSS to the gates of the transistors 372 and 374 and VARY/2 to the sources of the transistors 372 and 374 during standby in comparison to creating the negative gate-source voltage condition by providing a negative bias to the gates of the transistors 372 and 374 and VSS to the sources of the transistors 372 and 374.

Figure 4:
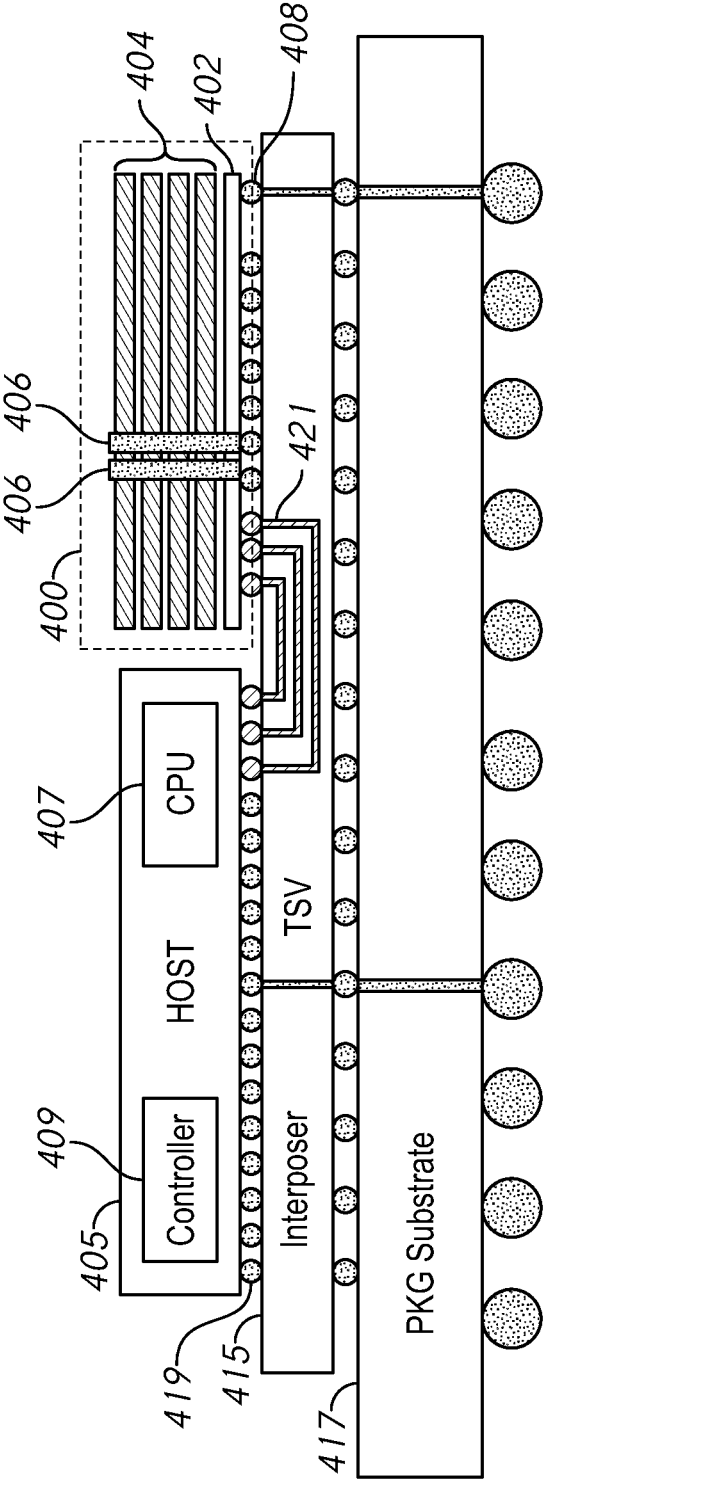
FIG. 4 is a diagram of an example semiconductor system including a semiconductor device according to some embodiments of the disclosure.

FIG. 4 is a diagram of an example semiconductor system including a semiconductor device 400 according to some embodiments of the disclosure. The semiconductor system may include a semiconductor device 400, which may be a three-dimensional (3D) memory device in some examples, and a host 405. In some embodiments of the disclosure, the semiconductor device 400 includes the semiconductor device 100 of FIG. 1, the portion of the memory array 200 of FIG. 2, and/or the memory access circuits of FIG. 3. The host 405 may include a central processing unit (CPU) 407 and/or a memory controller 409. The semiconductor device 400 and host 405 may be disposed on an interposer 415 on a package substrate 417.

The semiconductor device 400 may be a high bandwidth memory (HBM) in some embodiments. The semiconductor device 400 may include multiple die including a logic die 402 and core die 404 stacked with each other. In this example, each core die 404 may be a memory die. Each of the core die 404 may include memory cells, which may be arranged in a memory array. The core die 404 may further include circuitry for accessing the memory cells. In some examples, the memory cells may be DRAM memory cells. The logic die 402 may include circuitry for accessing the memory cells on the core die 404 for memory operations. For example, the logic die 402 may include a command/address input circuit for receiving commands and addresses from the memory controller 409. In some examples, the logic die 402 may include an internal clock generator for providing clock signals to the core die 404 and/or other components of the logic die 402. In some examples, the logic die 402 may include an internal voltage generator for receiving external voltages (e.g., VSS, VDD, VDDQ) and providing various internal voltages to the core die 404 and/or other components of the logic die 402.

The semiconductor device 400 may include conductive through silicon vias (TSVs) 406 (e.g., through substrate electrodes) which couple the logic die 402 and core die 404 by penetrating the logic die 402 and core die 404. The logic die 402 may be coupled to the interposer 415 via interconnects, such as bumps 408 exposed on an outside of the logic die 402. In some embodiments, one or more of the bumps 408 may be data (DQ) terminals. The bumps 408 may be coupled to bumps 419 of the host 405 via conductive lines 421. The conductive lines 421 and bumps 419 may allow signals, such as data signals, to be provided to the controller 409 and/or CPU 407 of the host 405.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
an activation voltage supply line;
a sense amplifier coupled to the activation voltage supply line and configured to be activated by an activation voltage provided on the activation voltage supply line;
a pair of local input/output lines;
a pair of global input/output lines;
a read-write circuit supply line; and
a read-write circuit coupled to the pair of local input/output lines and the pair of global input/output lines, and further coupled to the activation voltage supply line through the read-write circuit supply line, the read-write circuit configured to drive the pair of global input/output lines based on voltages of the pair of local input/output lines when activated for a read operation and further configured to drive the pair of local input/output lines based on voltages of the pair of global input/output lines when activated for a write operation, the read-write circuit supply line configured to provide a voltage of the activation voltage supply line to the read-write circuit.

2. The apparatus of claim 1, further comprising a read-write control circuit configured to provide a read control signal and a write control signal to the read-write circuit, the read-write control circuit including a read control circuit configured to provide the read control signal having an active voltage for a read access operation or to provide the read control signal having an inactive voltage for a standby mode.

3. The apparatus of claim 2, further comprising a sense amplifier precharge circuit coupled to the activation voltage supply line and configured to provide a precharge voltage to the activation voltage supply line in the standby mode.

4. The apparatus of claim 3 wherein the inactive voltage is ground and the precharge voltage is one-half a supply voltage.

5. The apparatus of claim 2 wherein the read-write circuit comprises a read circuit coupled to the pair of global input/output lines and the pair of local input/output lines, and further coupled to the activation voltage supply line, the read circuit configured to change a voltage of at least one global input/output line of the pair of global input/output lines based on a voltage of at least one local input/output line of the pair of local input/output lines for a read operation.

6. The apparatus of claim 5 wherein the read circuit comprises:
first and second transistors coupled in series to a first global input/output line of the pair of global input/output lines and to the activation voltage supply line; and third and fourth transistors coupled in series to a second global input/output line of the pair of global input/output lines and to the activation voltage supply line,
wherein gates of the first and third transistors are configured to receive the read control signal, a gate of the second transistor coupled to a first local input/output line of the pair of local input/output lines, and a gate of the fourth transistor coupled to a second local input/output line of the pair of local input/output lines.

7. The apparatus of claim 5 wherein the read-write circuit further comprises a write circuit coupled to the pair of global input/output lines and the pair of local input/output lines and configured to couple voltages of the pair of global input/output lines to the pair of local input/output lines for a write operation.

8. The apparatus of claim 7 wherein the write circuit comprises:
a first transistor coupled to a first global input/output line of the pair of global input/output lines and to a first local input/output line of the pair of local input/output lines; and
a second transistor coupled to a second global input/output line of the pair of global input/output lines and to a second local input/output line of the pair of local input/output lines,
wherein gates of the first and second transistors are configured to receive the write control signal.

9. The apparatus of claim 1, further comprising an activation voltage circuit coupled to the activation voltage supply line, and when activated, the activation voltage circuit configured to provide a low activation voltage to the activation voltage supply line.

10. An apparatus, comprising:
an activation voltage supply line;
a read-write circuit coupled to the activation voltage supply line;
a plurality of sense amplifiers coupled to the activation voltage supply line;
a sense amplifier precharge circuit coupled to the activation voltage supply line and configured to provide a precharge voltage to the activation voltage supply line;
an activation voltage circuit coupled to the activation voltage supply line and configured, when activated, to provide a low activation voltage to the activation voltage supply line; and
a read-write control circuit coupled to the read-write circuit, the read-write control circuit configured to provide a write control signal to the read-write circuit, and further configured to provide a read control signal to the read-write circuit having an active voltage for a read access operation and having a ground voltage for a standby mode,
wherein the activation voltage supply line having the precharge voltage for the standby mode.

11. The apparatus of claim 10 wherein the read-write circuit is configured to be activated for a read access operation by the read control signal having the active voltage and to be activated for a write access operation by an active write control signal.

12. The apparatus of claim 11 wherein the read-write circuit is configured to provide the write control signal having a ground voltage for the standby mode.

13. The apparatus of claim 10, further comprising:
a second activation voltage supply line; and
a second activation voltage circuit coupled to the second activation voltage supply line and configured to provide a high activation voltage for the access operation, wherein the activation voltage provided by the activation voltage circuit for the access operation is a low activation voltage.

14. The apparatus of claim 10, further comprising a pair of local input/output lines coupled to the read-write circuit and to the plurality of sense amplifiers.

15. The apparatus of claim 14 wherein the read circuit comprises:

first and second transistors coupled in series; and third and fourth transistors coupled in series, wherein a gate of the second transistor coupled to a first local input/output line of the pair of local input/output lines, and a gate of the fourth transistor coupled to a second local input/output line of the pair of local input/output lines, and gates of the first and third transistors are configured to receive the read control signal, and sources of the first and third transistors are coupled to the activation voltage supply line.

16. A method, comprising:

providing a voltage from an activation voltage supply line to a plurality of sense amplifiers and the voltage from the activation voltage supply line through a read-write circuit supply line to a read-write circuit;

activating the read-write circuit for a read access operation with a read control signal having an active voltage; and during standby, providing the read control signal to the read-write circuit having an inactive voltage.

17. The method of claim 16 wherein the inactive voltage of the read control signal is ground.

18. The method of claim 17, further comprising providing a voltage on the activation voltage supply line during standby to cause a negative gate-source voltage condition for a plurality of transistors included in the read-write circuit.

19. The method of claim 16, further comprising during standby, providing a precharge voltage on the activation voltage supply line to the plurality of sense amplifiers and the read-write circuit.

\* \* \* \* \*